United States Patent
Chen

(10) Patent No.: US 6,924,702 B2
(45) Date of Patent: Aug. 2, 2005

(54) LOW SUPPLY VOLTAGE AND SELF-BIASED HIGH SPEED RECEIVER

(75) Inventor: Chung-Hui Chen, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 10/463,357

(22) Filed: Jun. 17, 2003

(65) Prior Publication Data

US 2005/0001681 A1 Jan. 6, 2005

(51) Int. Cl.⁷ .................................................. H03F 3/45
(52) U.S. Cl. ...................................... 330/253; 330/261
(58) Field of Search ................................ 330/253, 260, 330/261, 263, 264

(56) References Cited

U.S. PATENT DOCUMENTS

| | | | | |
|---|---|---|---|---|
| 4,958,133 A | * | 9/1990 | Bazes ........................ 330/253 |
| 5,278,467 A | * | 1/1994 | Nedwek ........................ 327/52 |
| 6,118,318 A | * | 9/2000 | Fifield et al. ................ 327/206 |
| 6,169,424 B1 | * | 1/2001 | Kurd ............................. 327/53 |
| 6,469,579 B2 | * | 10/2002 | Bazes ......................... 330/253 |

* cited by examiner

Primary Examiner—Khanh V. Nguyen
(74) Attorney, Agent, or Firm—Thomas, Kayden, Horstemeyer & Risley

(57) ABSTRACT

A low supply voltage and self-biased high speed receiver comprising both thin and thick gate oxide MOSFETs in deep submicron technology. The receiver operates with an IO supply voltage higher than its core MOSFET operating voltage. The input signals are received by the thick gate oxide devices and the thin gate oxide devices are free from gate oxide stress, which eliminates the reliability problem. The current supplies formed by thin oxide devices provide a high supply current so that neither additional higher voltage supply nor low Vt IO device is needed, and the circuit area for the current supplies is reduced.

10 Claims, 5 Drawing Sheets

LOW SUPPLY VOLTAGE AND SELF-BIASED HIGH SPEED RECEIVER

BACKGROUND OF THE INVENTION

1. Field of the Invention

The present invention relates to a receiver and particularly to a CMOS complementary self-biased differential amplifier used in a receiver with IO supply voltage higher than its core MOSFET operating voltage.

2. Description of the Related Art

Various input buffer amplifiers for buffering an input signal prior to coupling that signal to other circuitry are well known in the prior art. Some of these input buffer amplifiers are also known as level shifters, wherein input voltage levels are shifted to be compatible with voltage levels of the associated circuitry. For example, many input voltage levels are specified as being compatible with standard transistor-transistor-logic (TTL) logic levels, that is, a logic threshold of 1.4 volts with a margin of 0.6 volts about the threshold. A typical high logic level TTL signal can be as low as 2.0 volts (VIH parameter), while a low logic level TTL signal can be as high as 0.8 volts (VIL parameter). However, when this TTL level signal is to be used in conjunction with complementary metal oxide semiconductor (CMOS) circuitry, the input levels must be changed to be compatible with the CMOS circuit. Typical CMOS logic thresholds vary from approximately 2.0 to 3.0 volts, while the margin around the threshold can be substantially equal to the difference between the threshold and the supply rails. An input buffer translates the TTL compatible levels of the inputs to the CMOS compatible levels for use with CMOS circuitry inside a CMOS chip. The CMOS chip also includes the input buffer on the chip.

FIG. 3 shows a circuit for a self-biased operational amplifier, used as the input buffer, disclosed in U.S. Pat. No. 6,469,579. The operational amplifier of FIG. 3 may be considered a transconductance amplifier, in that a small-signal current is provided to a load in response to a differential voltage at input nodes 102 and 104. The load in FIG. 3 may be taken as the output resistance of transistor 35B in parallel with the transistor 36B. The operational amplifier of FIG. 3 is self-biasing as no external biasing is needed.

The transistors 31A and 31B are pMOSFETs (p-Metal-Oxide-Semiconductor-Field-Effect-Transistor) arranged as a first differential pair of transistors having their supplies connected to each other, and transistors 32A and 32B are nMOSFETs arranged as a second differential pair having their supplies connected to each other. The two differential pairs are complementary to each other in that they comprise transistors having complementary carrier types, i.e., the transistors 31A and 31B are of p-carrier type and the transistors 32A and 32B are of n-carrier type. The gates of the transistors 31A and 32A are connected to the input node 302, and the gates of the transistors 31B and 32B are connected to the input node 304.

The transistor 33 supplies bias current to the differential pair 31A and 31B. The transistors 38A and 38B comprise a current mirror. The transistor 38A sinks bias currents from the transistors 31A and 36A, and the transistor 38B sinks bias current from the transistors 31B and 36B. The bias current supplied by the transistor 33 is equal in magnitude to the sum of the bias current sunk by the transistors 31A and 31B. When the voltage differential between the nodes 302 and 304 is zero, the transistors 38A and 38B sink equal bias currents.

Similarly, the transistors 37A and 37B comprise a current mirror. The transistor 37A supplies bias current to the transistors 32A and 35A, and the transistor 37B supplies bias current to the transistors 32B and 32B. The transistor 34 sinks bias current from the differential pair 2A and 2B. The bias current sunk by the transistor 34 is equal in magnitude to the sum of the bias current supplied by the transistors 32A and 32B. When the voltage differential between the nodes 302 and 304 is zero, the transistors 37A and 37B supply equal bias current.

The gate of the transistor 37A is connected to its drain, as well as to the gates of the transistors 33 and 37B. Because the gate of the transistor 37A is connected to its drain, it is biased in its saturation region as long as its gate-supply voltage $V_{GS}$ has a negative value higher than $V_{TP}$, the pMOSFET threshold voltage. Consequently, the transistors 33 and 37B are also biased in their saturation regions within a margin of $V_{TP}$. Similarly, the gate of the transistor 38A is connected to its drain, as well as to the gates of the transistors 34 and 38B. Because the gate of the transistor 38A is connected to its drain, it is biased in its saturation region as long as its gate-supply voltage $V_{GS}$ is more positive than $V_{TN}$, the nMOSFET threshold voltage. Consequently, the transistors 34 and 38B are also biased in their saturation regions within a margin of $V_{TN}$.

The transistors 32B and 35B are arranged as a folded-cascode pair. The transistor 35B is a pMOSFET, so that the folded-cascode pair 32B and 35B is comprised of transistors having complementary carrier types. The cascode transistor 35B provides impedance translation. That is, the impedance at the node 312 is significantly smaller than the impedance at node 306. Similarly, the transistors 31B and 36B are arranged as a folded-cascode pair with complementary carrier types, where the impedance at the node 314 is much smaller than the impedance at the node 306. The use of the cascode transistors 35B and 36B provides a high output impedance, which helps to provide a high amplifier gain because gain is determined by the product of the input transconductance and the output impedance.

The transistors 35A and 32A, and 36A and 31A, are arranged as folded-cascode pairs having complementary carrier types. The gate of the transistor 35A is connected to its drain, and the gate of the transistor 36A is connected to its drain, so that the transistors 35A and 36A are biased in their saturation regions. The gates and drains of the transistors 35A and 36A, which are at the same potential, are connected to the gates of the transistors 35B and 36B, and, thereby, bias them.

FIG. 4 is a circuit schematic diagram of a self-biased, high-gain differential amplifier disclosed in U.S. Pat. No. 4,937,476. The purpose of the comparator 40 is to convert $V_{IN}$, which typically has TTL level signals, to a CMOS compatible $V_{OUT}$, wherein the switching level is determined by the value of $V_{REF}$. A CMOS transistor pair comprised of the p-type transistor 41 and the n-type transistor 42 are coupled in series between the nodes 471 and 472. The node 471 is coupled to a voltage supply, such as VCC, through a p-type transistor 44. The node 472 is coupled to VSS, which in this case is ground, through an n-type transistor 45. The drains of the transistors 41 and 42 are coupled together to the gates of the transistors 44 and 45. The gates of the transistors 41 and 42 are driven by the signal $V_{REF}$.

Also coupled in series between the nodes 471 and 472 is another pair of CMOS transistors formed by p-type transistor 46 and n-type transistor 47. The gates of the transistors 46 and 47 are coupled together to receive $V_{IN}$, and the drains of these two transistors 46 and 47 are coupled to drive the gates of a third set of CMOS transistors 48 and 49. A signal $V_{COMP}$ is obtained at the drain junction of the transistors 46 and 47. $V_{COMP}$ is coupled to drive the gates of a CMOS inverter formed by the transistors 48 and 49. The P-type transistor 48 and n-type transistor 49 are coupled in series between VCC and VSS, and $V_{OUT}$ is obtained from their drain junction.

The comparator 40 is actually a differential amplifier. In operation, the transistors 41 and 42 are identical in size and structure to the transistors 46 and 47, respectively. This is done so that both CMOS pairs have identical electrical behavior. The transistors 44 and 45 are utilized to provide bias for the transistors 41, 42, 46 and 47. Because the transistors 41 and 42 conduct together, the connection at their drains provides a biasing voltage $V_{BIAS}$, which is then coupled to the gates of the transistors 44 and 45. This results in a self-biasing technique, wherein the transistors 41 and 42 operate in their active regions in spite of variations attributed to processing and temperature.

The size of the transistors 41, 42, 44 and 45 are chosen so that under typical conditions for processing, temperature and VCC, the transistors 41 and 42 are biased substantially in the center of their active region. Under certain conditions, the bias point of the transistors 41 and 42 will shift away from the center of the active region, either above or below the center, depending on the nature of the conditions. However, due to the negative feedback provided by the transistors 44 and 45 at nodes 471 and 472, and through the negative feedback inherent in the self-biasing technique, the shift in the bias point will be minimized, and the bias point will remain within the active region of the transistors 41 and 42.

Because the transistors 46 and 47 are identical in all respects to the transistors 41 and 42, when $V_{IN}$ is equal to $V_{REF}$, the transistors 46 and 47 will become biased identically to the transistors 41 and 42. That is, the transistors 46 and 47 will also be biased in the active region. Therefore, the VCOMP voltage on the drain junction of the transistors 46 and 47 will be equal to the voltage $V_{BIAS}$ $V_{BIAS}$, along with $V_{COMP}$, will have a value somewhere between the high state and the low state of $V_{IN}$.

When $V_{IN}$ transitions from a low state to a high state, then $V_{COMP}$ will switch from a high level to a low level, with the center of the switching region at or very near to the point where $V_{IN}$ equals $V_{REF}$. Furthermore, the switching characteristic of $V_{COMP}$ will be sharp about the point where $V_{IN}$ equals $V_{REF}$, with $V_{COMP}$ making a full transition from a high state to a low state for a small change in $V_{IN}$. The transistors 48 and 49 serve as an inverter and amplify $V_{COMP}$ further in order to obtain a full output swing from VCC to VSS as $V_{OUT}$.

An n-type device 473 has its gate coupled to the node 471 and its drain and supply coupled to VSS. The device 473 is coupled to function as a capacitor. When $V_{IN}$ switches from a high state to a low state, $V_{COMP}$ switches from a low state to a high state, and device 473 provides some of the charging current necessary to charge the parasitic capacitance on $V_{COMP}$, thereby speeding the rise time of the comparator. It should be noted that a p-type device 474 can be coupled to the node 472 to improve the fall time of the comparator.

FIG. 5 shows a differential amplifier circuit 50 disclosed in U.S. Pat. No. 4,958,133. The purpose of differential amplifier 50 is to amplify differential input voltages VA and VB of inputs A and B, respectively, whose common-mode component can vary over an extremely wide range of voltages. The extended range for the common-mode voltages is to the two rails, shown to be Vcc and Vss in FIG. 5, wherein the differential-mode gain of the amplifier still remains sufficiently high for the amplifier to be functional over this range of voltages.

The amplifier 50 is coupled to receive two differential inputs A and B, as voltages VA and VB, on lines 511 and 512, respectively, and to provide a single-ended output VOUT on a line 513. The amplifier 50 is completely complementary and is substantially symmetrical about nodes 520 and 521. The transistors 51a–52a and 55a–58a reside to the left of the nodes 520 and 521 in FIG. 5 and are applicable to the amplification of input signal A. The transistors 51b–52b and 55b–56b reside to the right of the nodes 520 and 521 in the drawing of FIG. 5 and are applicable in the amplification of input signal B. The transistors 53 and 54 are at the center of the symmetry and are applicable to both sides of the circuit.

The transistor 53 is a p-type device coupled between the node 520 and a supply voltage (positive rail voltage), which in this instance is Vcc. The transistor 54 is an n-type device coupled between the node 521 and a supply return Vss (negative rail voltage), which in this instance is ground. The gates of the transistors 53 and 54 are coupled together, and these two transistors 53 and 54 operate as a complementary pair. The transistors 55a–58a are coupled in series between Vcc and Vss. The transistor 55a is a p-type device having its supply coupled to Vcc and its drain coupled to the supply of the transistor 57a. The transistor 57a is also a p-type device having its drain coupled to the drain of the transistor 58a. The transistor 58a is an n-type device and has its supply coupled to the drain of the transistor 56a. The transistor 56a is also an n-type device and has its supply coupled to Vss. The gates of the transistors 55a–58a are coupled together on the line 522, wherein the line 522 is also coupled to the gates of the transistors 53 and 54.

The transistors 55a and 56a form the first complementary transistor pair in the series leg, while transistors 57a and 58a form the other complementary transistor pair of this series leg. Conversely transistors 55b–56b are also coupled in series between Vcc and Vss equivalently to the transistors 55a–58a. The transistors 55b and 56b operate as the first complementary transistor pair and the transistors 57b and 58b operate as the other complementary transistor pair in the right series leg. The gates of the transistors 55b–58b are coupled together to the line 522.

The transistor 51a is a p-type device having its supply coupled to the node 520 and its drain coupled to the drain-supply junction of the transistors 56a and 58a. The transistor 52a is an n-type device having its supply coupled to the node 521 and its drain coupled to the drain-supply junction of the transistors 55a and 57a. The gates of the transistors 51a and 52a are coupled together to the line 511 for accepting input A. The transistors 51a and 52a operate as a complementary pair.

The transistor 51b is a p-type device having its supply coupled to the node 520 and its drain coupled to the drain-supply junction of the transistors 56b and 58b. The transistor 52b is an n-type device having its supply coupled to the node 521 and its drain coupled to the drain-supply junction of the transistors 55b and 57b. The gates of the transistors 51b and 52b are coupled together to the line 512 for accepting input B. The transistors 51b and 52b operate as a complementary transistor pair.

It is to be noted that the amplifier 50 is completely complementary since each transistor device has a complementary counterpart of the opposite conduction type.

Further, the amplifier 50 is symmetrical except for the "short-circuit" of the drains 57a and 58a to the line 522. This "short-circuit" is denoted as BIAS in FIG. 5, and the voltage at this point is referred to as VBIAS. At the right (B-input side) side of the circuit, drains of the transistors 57b and 58b are not coupled to the line 522. Instead these drains are coupled to the output line 513, wherein an output from the amplifier 50 is taken from the line 513 as VOUT.

It is to be further noted that all of the transistors of the amplifier 50, except for the transistors 53 and 54, are comprised of matched device pairs. The matched pairs are denoted by the same reference numeral and differentiated by the suffix a or b. For example, the transistors 51a and 51b comprise one of the matched pairs.

Each of the transistor pairs 51a and 58a, 51b and 58b, 52a and 57a, and 52b and 57b, comprises a "folded-cascode" pair. Each of these transistor pairs comprises a cascode pair since the drain of the first device in the pair is cascaded with the supply of the second device in the pair in typical cascode fashion. Each of these pairs is "folded" since the two devices in each pair are of opposite conduction type. Therefore, the small-signal current output from the drain of the first device in the pair "folds around" when it enters the supply of the second device in the pair.

The BIAS node 523 provides the bias voltage VBIAS for the amplifier 50. The bias is generated by the negative feedback from the drains of the transistors 57a and 58a to the gates of the transistors 55a–58a, 55b–58b, 53 and 54. This negative feedback causes the bias voltage to be stable and insensitive to variations in processing, supply voltage, temperature, and common-mode input voltage. Because the bias for the amplifier 50 is generated internally to the amplifier itself, the amplifier provides a self-bias (no external biasing scheme is used).

However, none of the previously described prior arts are suitable for a receiver with IO supply voltage higher than its core MOSFET operating voltage. When the IO supply voltage is much lower than its I/O thick oxide MOSFET operating voltage (for example, a 1.5V HSTL/JEDEC 8–6 receiver, designed by 3.3V IO MOSFET process whose core MOSFET is operated at only 1.2V), the amplifiers in the prior arts do not function unless an extra supply voltage, such as VDDIO of 3.3V or VCC disclosed in U.S. Pat. No. 4,958,133, is used to supply the operational amplifier. Other solutions without using an extra supply of a voltage higher than VDDIO may introduce a low Vt MOSFET which has the same gate oxide thickness as the thick gate oxide device as original IO devices. Since the threshold voltage is lower, the prior art can function under very low supply voltage. However, extra implant steps and masks are necessary during the manufacturing process of the receiver, which increases the cost.

Alternatively, the amplifier may amplify the received small signal successfully if all the MOSFETs in the prior arts are replaced with thin gate oxide devices. However, the thin gate oxide may be damaged since it cannot stand the input voltage higher than its operating voltage. For example, connecting a 1.2V thin gate oxide device to a 1.5V HSTL output may damage the gate oxide since 1.5V is higher than the 10-year life time voltage limitation of 1.2V.

SUMMARY OF THE INVENTION

The object of the present invention is to provide a CMOS complementary self-biased differential amplifier used in a receiver with IO supply voltage higher than its core MOSFET operating voltage.

The present invention provides a differential operational amplifier comprising a first and second transistor of a first type, having source coupled together, gates respectively coupled to receive a first and second input signal, and drains respectively coupled to receive a bias voltage and outputting an output signal, a third transistor of the first type having a source coupled to receive a first supply voltage, a gate coupled to receive the bias voltage and a drain coupled to the source of the first and second transistors, a fourth and fifth transistor of the first type, and a sixth transistor of a second type, all of which are coupled in series between the first and a second supply voltage, and have gates commonly coupled to the drain of the fifth transistor, the drain of the fifth transistor outputting the bias voltage, an eighth and ninth transistor of the first type, and a tenth transistor of the second type, all of which are coupled in series between the first and second supply voltage, and have gates commonly coupled to receive the bias voltage, the drain of the ninth transistor coupled to the drain of the second transistor; and an eleventh and seventh transistor of the second type having first terminals commonly coupled to the drain of the second transistor, second terminals commonly coupled to receive the bias voltage, and gates respectively coupled to the drain of the second transistor and to receive the bias voltage, wherein gate oxides of the first and second transistors are thicker than those of the others.

The present invention provides another differential operational amplifier comprising a first and second transistor of a first type, and a third and fourth transistor of a second type, the first and second transistor having sources coupled together, gates respectively coupled to receive a first and second input signal, and drains respectively coupled to receive a bias voltage and outputting an output signal, the third and fourth transistor having sources coupled together, gates respectively coupled to receive the first and second input signal, and drains, a fifth and sixth transistor respectively of the first and second type having sources coupled to receive a first and second supply voltage, gates commonly coupled to receive the bias voltage and drains coupled to the sources of the first and second transistor, and the third and fourth transistor, respectively, a seventh and eighth transistor of the first type, a ninth transistor of the second type, all of which are coupled in series between the first and second supply voltage, and have gates commonly coupled to the drain of the eighth transistor, the drain and source of the eighth transistor respectively outputting the bias voltage and coupled to the drains of the third transistor, a tenth and eleventh transistor of the first type, and a twelfth transistor of the second type, all of which are coupled in series between the first and second supply voltage, and have gates commonly coupled to receive the bias voltage, the drain and source of the eleventh transistor respectively outputting the output signal and coupled to the drain of the fourth transistor, and a thirteenth and fourteenth transistor of the second type having first terminals commonly coupled to the drain of the eleventh transistor, second terminals commonly coupled to receive the bias voltage, and gates respectively coupled to the drain of the eleventh transistor and to receive the bias voltage, wherein gate oxides of the first, second, third and fourth transistors are thicker than those of the others.

The present invention further provides a receiver comprising an interface circuit having a differential amplifier and a core circuit receiving the output signal from the interface circuit. The differential amplifier comprises a first and second transistor of a first type, having sources coupled together, gates respectively coupled to receive a first and second input signal, and drains respectively coupled to receive a bias voltage and outputting an output signal, a third transistor of the first type having a source coupled to receive a first supply voltage, a gate coupled to receive the bias voltage and a drain coupled to the sources of the first and second transistors, a fourth and fifth transistor of the first type, and a sixth transistor of a second type, all of which are coupled in series between the first and a second supply voltage, and have gates commonly coupled to the drain of the fifth transistor, the drain of the fifth transistor outputting the bias voltage, an eighth and ninth transistor of the first type, and a tenth transistor of the second type, all of which are coupled in series between the first and second supply voltage, and have gates commonly coupled to receive the bias voltage, the drain of the ninth transistor coupled to the drain of the second transistor, and an eleventh and seventh transistor of the second type having first terminals commonly coupled to the drain of the second transistor, second terminals commonly coupled to receive the bias voltage, and gates respectively coupled to the drain of the second transistor to receive the bias voltage, wherein gate oxides of the first and second transistors are thicker than those of the others.

The present invention further provides another receiver comprising an interface circuit having a differential amplifier and a core circuit receiving the output signal from the interface circuit. The differential amplifier comprises a first and second transistor of a first type, and a third and fourth transistor of a second type, the first and second transistor having sources coupled together, gates respectively coupled to receive a first and second input signal, and drains respectively coupled to receive a bias voltage and outputting an output signal, the third and fourth transistor having sources coupled together, gates respectively coupled to receive the first and second input signal, and drains, a fifth and sixth transistor respectively of the first and second type having sources coupled to receive a first and second supply voltage, gates commonly coupled to receive the bias voltage and drains coupled to the sources of the first and second transistor, and the third and fourth transistor, respectively, a seventh and eighth transistor of the first type, and a ninth transistor of the second type, all of which are coupled in series between the first and second supply voltage, and have gates commonly coupled to the drain of the eighth transistor, the drain and source of the eighth transistor respectively outputting the bias voltage and coupled to the drains of the third transistor, a tenth and eleventh transistor of the first type, and a twelfth transistor of the second type, all of which are coupled in series between the first and second supply voltage, and have gates commonly coupled to receive the bias voltage, the drain and source of the eleventh transistor respectively outputting the output signal and coupled to the drain of the fourth transistor, and a thirteenth and fourteenth transistor of the second type having first terminals commonly coupled to the drain of the eleventh transistor, second terminals commonly coupled to receive the bias voltage, and gates respectively coupled to the drain of the eleventh transistor and to receive the bias voltage, wherein gate oxides of the first, second, third and fourth transistors are thicker than those of the others.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

A CMOS complementary self-biased differential amplifier used in a receiver with IO supply voltage higher than its core MOSFET operating voltage is described. In the following description, numerous specific details are set forth, such as specific circuit components, signals, etc., to provide a thorough understanding of the present invention. It will be obvious, however, to one skilled in the art that the present invention may be practiced without these specific details. In other instances, processing steps, control lines, and well-known structures have not been set forth in detail in order not to obscure the present invention in unnecessary detail.

Figure 1:
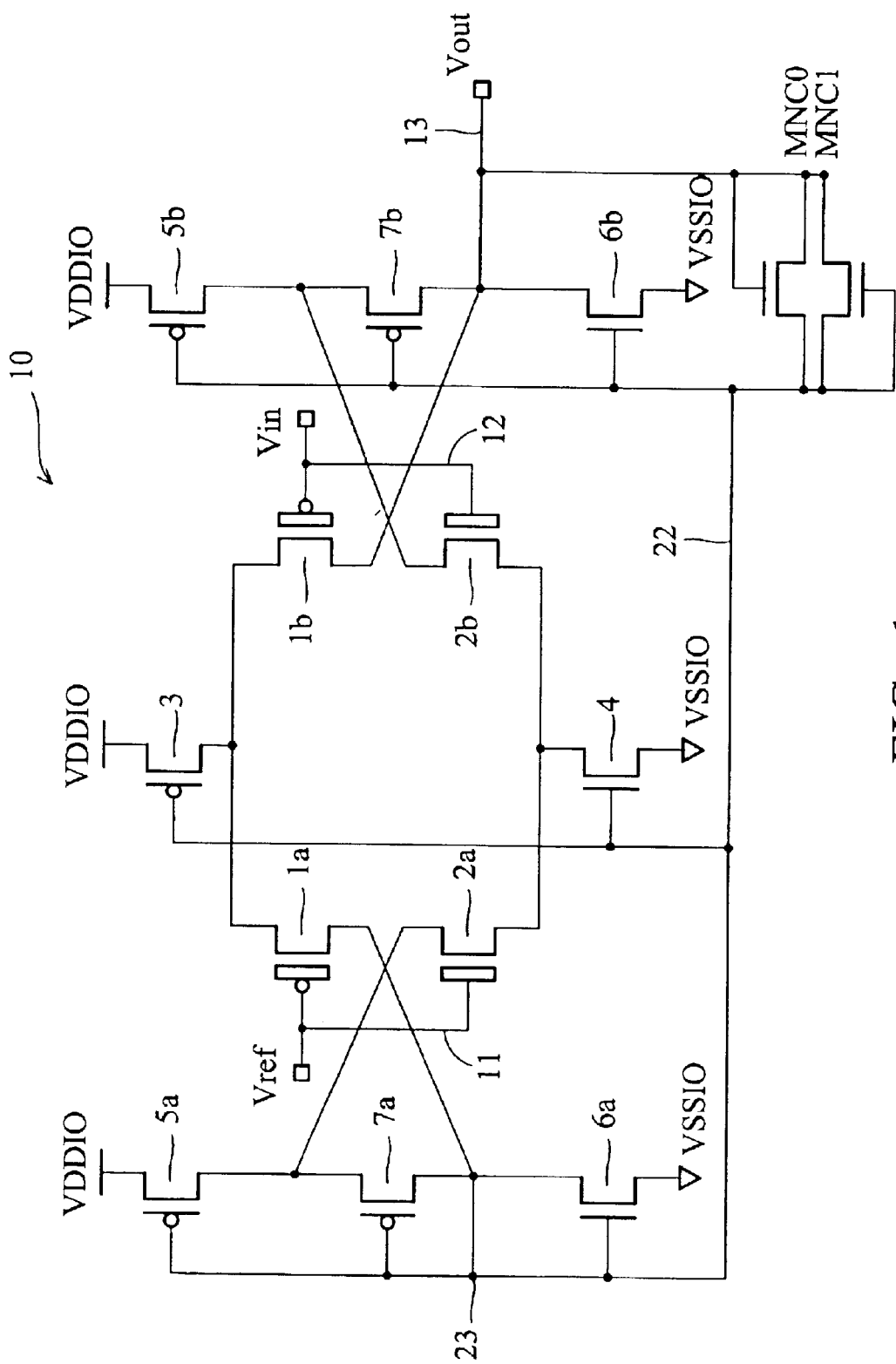
FIG. 1 is a diagram showing a differential amplifier according to one embodiment of the invention.

Referring to FIG. 1, a differential amplifier circuit 10 of the preferred embodiment is shown. The purpose of the differential amplifier 10 is to amplify differential input voltages Vref and Vin of inputs A and B, respectively, whose common-mode component can vary over an extremely wide range of voltages. The extended range for the common-mode voltages is to the two rails, shown to be VDDIO and VSSIO in FIG. 1, wherein the differential-mode gain of the amplifier still remains sufficiently high for the amplifier to be functional over this range of voltages.

The amplifier 10 is coupled to receive the two differential inputs A and B, as the voltages Vref and Vin, on lines 11 and 12, respectively, and to provide a single-ended output VOUT on a line 13. The amplifier 10 is completely complementary and is substantially symmetrical in nodes 20 and 21. The transistors 1a–2a and 5a–7a reside to the left of the nodes 20 and 21 in FIG. 1 and are applicable to the amplification of the input signal Vref. The transistors 1b–2b and 5b–7b reside to the right of the nodes 20 and 21 in the drawing of FIG. 1 and are applicable in the amplification of the input signal Vin. The transistors 3 and 4 are at the center of the symmetrical area and are applicable to both sides of the circuit.

The transistor 3 is a p-type device coupled between the node 20 and a supply voltage (positive IO supply voltage), which in this instance is VDDIO. The transistor 4 is an n-type device coupled between the node 21 and a supply return VSSIO (negative IO supply voltage), which in this instance is ground. The gates of the transistors 3 and 4 are coupled together, and these two transistors 3 and 4 operate as a complementary pair. The transistors 5a–7a are coupled in series between VDDIO and VSSIO. The transistor 5a is a p-type device having its source coupled to VDDIO and its drain coupled to the source of the transistor 7a. The transistor 7a is also a p-type device having its drain coupled to the drain of transistor 6a. The transistor 6a is an n-type device and has its source coupled to VSSIO. The gates of transistors 5a–7a are coupled together on the line 22, wherein the line 22 is also coupled to the gates of the transistors 3 and 4.

The transistors 5b–7b are also coupled in series between VDDIO and VSSIO. The transistor 5b is a p-type device having its source coupled to VDDIO and its drain coupled to the source of the transistor 7b. The transistor 7b is also a p-type device having its drain coupled to the drain of transistor 6b. The transistor 6b is an n-type device and has its source coupled to VSSIO. The gates of transistors 5b–7b are coupled together on the line 22.

The transistor 1a is a p-type device having its source coupled to the node 20 and its drain coupled to the drain-source junction of transistors 6a and 7a. The transistor 2a is an n-type device having its source coupled to the node 21 and its drain coupled to the 7 drain-source junction of the transistors 5a and 7a. The gates of the transistors 1a and 2a are coupled together to the line 11 for accepting the input A. The transistors 1a and 2a operate as a complementary pair.

The transistor 1b is a p-type device having its source coupled to the node 20 and its drain coupled to the drain-source junction of transistors 6b and 7b. The transistor 2b is an n-type device having its source coupled to the node 21 and its drain coupled to the drain-source junction of the transistors 5b and 7b. The gates of the transistors 1b and 2b are coupled together to the line 12 for accepting the input B. The transistors 1b and 2b operate as a complementary transistor pair.

It is to be noted that the amplifier 10 is symmetrical except for the "short-circuit" of drains 7a and 6a to the line 22, and an output common mode feedback loop compose the transistors MNC0 and MNC1.

The "short-circuit" is denoted as BIAS in FIG. 1, and the voltage at this point is referred to as VBIAS. At the right (B-input side) side of the circuit, drains of transistors 7b and 6b are not coupled to the line 22. Instead these drains are coupled to output line 13, wherein an output from the amplifier 10 is taken from the line 13 as VOUT.

As for the output common mode feedback loop, the NMOS transistors MNC0 and MNC1 wherein their sources and drains are coupled together and respectively to the line 13 and 22, and their gates are respectively coupled to the line 13 and 22. The output common mode feedback loop clamps the output common mode level on VOUT to keep the output common mode.

It is to be further noted that all of the transistors of the amplifier 10, except for the transistors 3 and 4, are comprised of matched device pairs. The matched pairs are denoted by having the same reference numeral and differentiated by the suffix a or b. For example, the transistors 1a and 1b comprise one of the matched pairs.

The BIAS node 23 provides the bias voltage VBIAS for the amplifier 10. The bias is generated by the negative feedback from the drains of transistors 7a and 6a to the gates of transistors 5a–7a, 5b–7b, 3 and 4. This negative feedback causes the bias voltage to be stable and insensitive to variations in processing, supply voltage, temperature, and common-mode input voltage. Because the bias for the amplifier 10 is generated internally to the amplifier itself, the amplifier provides a self-bias (no external biasing scheme is used).

Accordingly, any variation in operating conditions, processing or in common-mode input voltage which causes the bias voltage VBIAS at the node 23 to rise, would also cause the voltage on the gates of the transistors 5a–7a to also increase. The transistors 5a–7a would then conduct in the direction that causes the biasing voltage at the node 23 to decrease. Furthermore, the transistors 3–4 and 5b–7b would also conduct in the direction that lowers the biasing voltage on the node 23, but to a lesser extent. Therefore, because of the negative feedback provided by the biasing voltage at the node 23, variations in operating conditions, in processing or in common-mode input-voltage would be compensated by the negative feedback scheme.

The negative feedback in the self-biasing scheme also contributes to a rejection (or attenuation) of common-mode input components. It is because of this common-mode rejection that the amplifier 10 is capable of operating over a wide range of common-mode input voltages than differential amplifiers of the prior art. An example illustration in the following describes how the amplifier can obtain a wide range of common-mode input voltages.

Hypothetically, if the input lines 11 and 12 are shorted together and are coupled to a voltage supply that generates a voltage VCOM in this instance, the differential input voltage is zero volts, while the common-mode voltage is VCOM. Because all match-paired transistors in the amplifier 10 are assumed to be perfectly matched, and since the gates of all device pairs receive the same voltage, the output voltage on the line 13 must necessarily be identical to the voltage on the node 23.

Assume now that VCOM begins to change. The bias voltage on the node 23 will also change in reaction to the change in VCOM. For example, if VCOM rises, then VBIAS will fall. However, the negative feedback that is inherent in the self-biasing scheme attenuates the change in VBIAS. With proper design, VBIAS would hardly vary at all even if VCOM varies from rail to rail. As noted above, VOUT must necessarily be equal to VBIAS, so VOUT also would hardly vary, even if VCOM varies from rail to rail. Thus, the self-bias of the amplifier serves to actively reject the common-mode input components.

Figure 2:
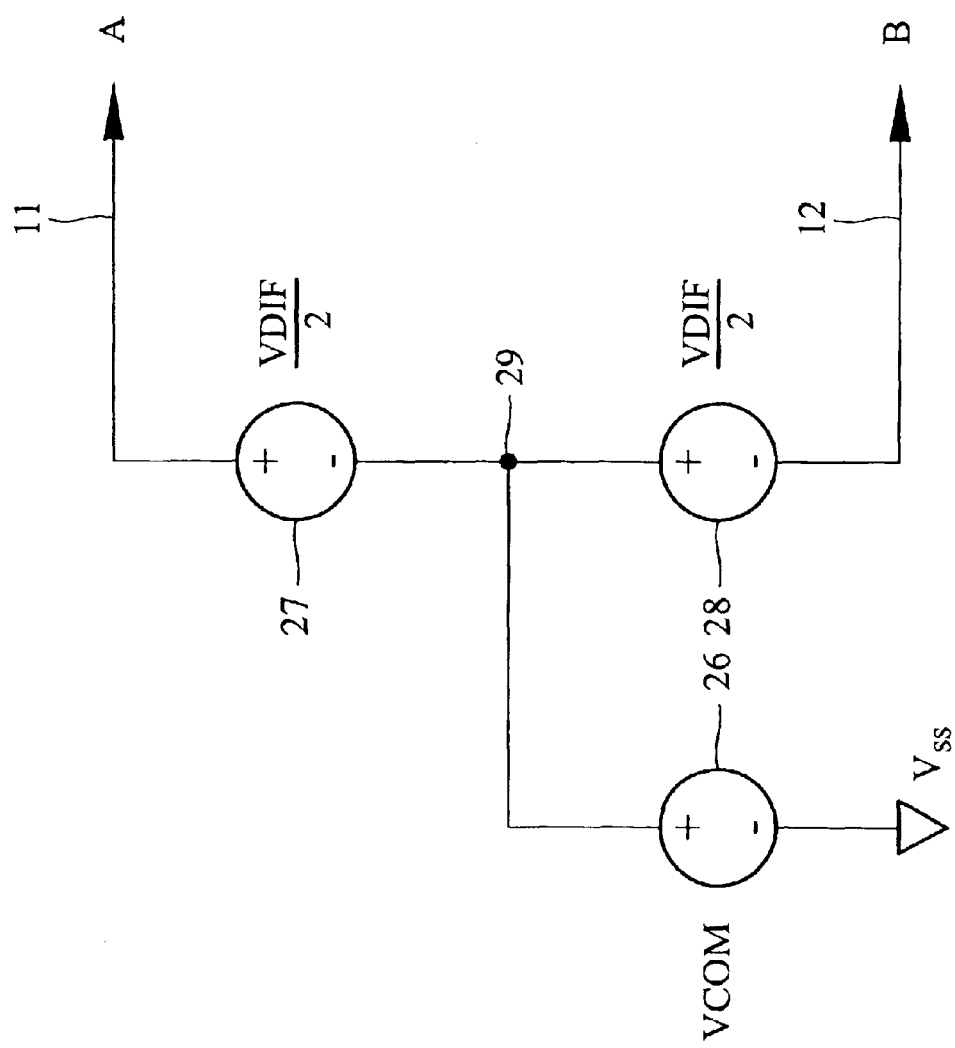
FIG. 2 is a diagram showing an equivalent circuit of a portion of the differential amplifier in FIG. 1.
Figure 3:
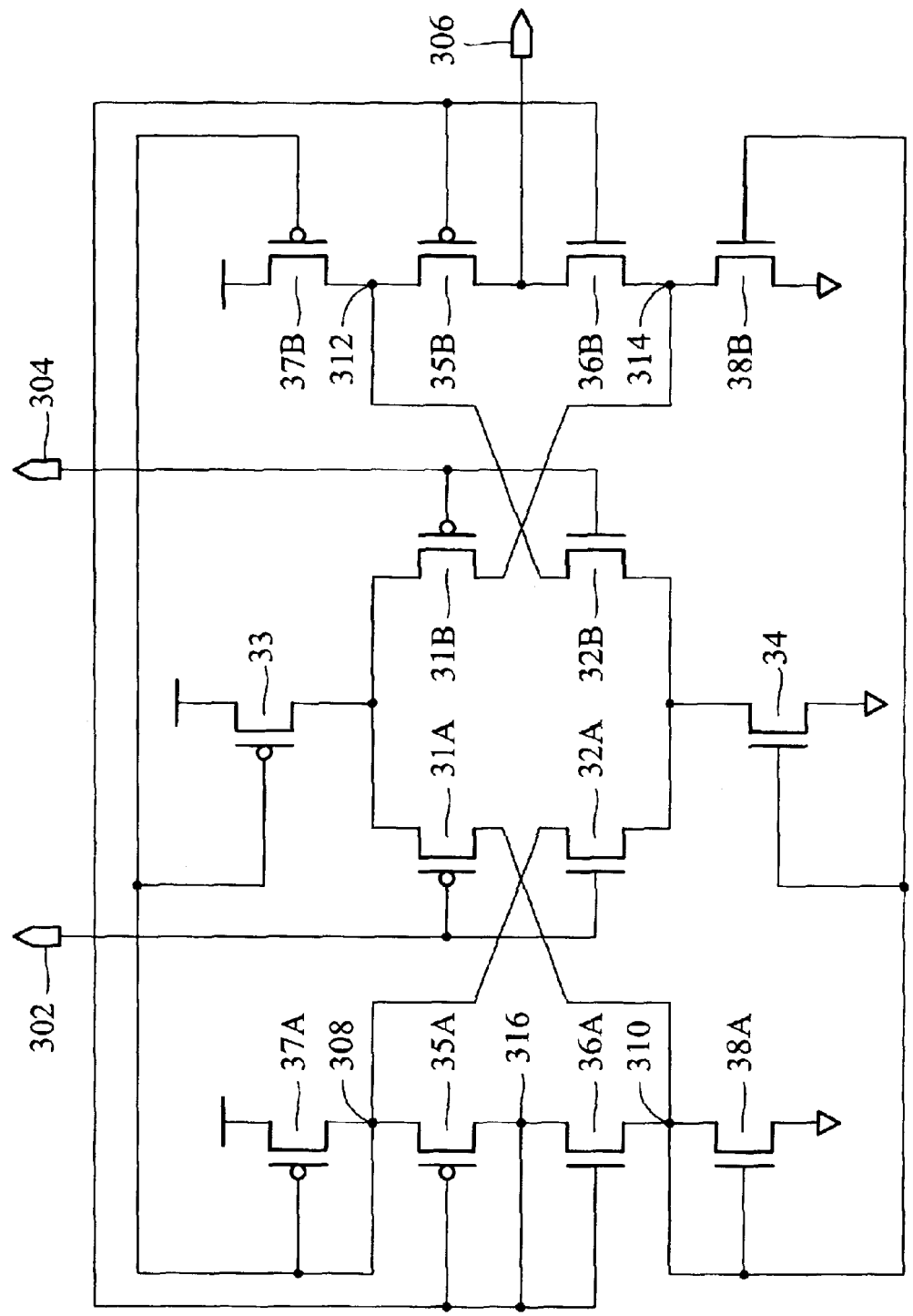
FIG. 3 is a diagram showing a circuit for a self-biased operational amplifier disclosed in U.S. Pat. No. 6,469,579.
Figure 4:
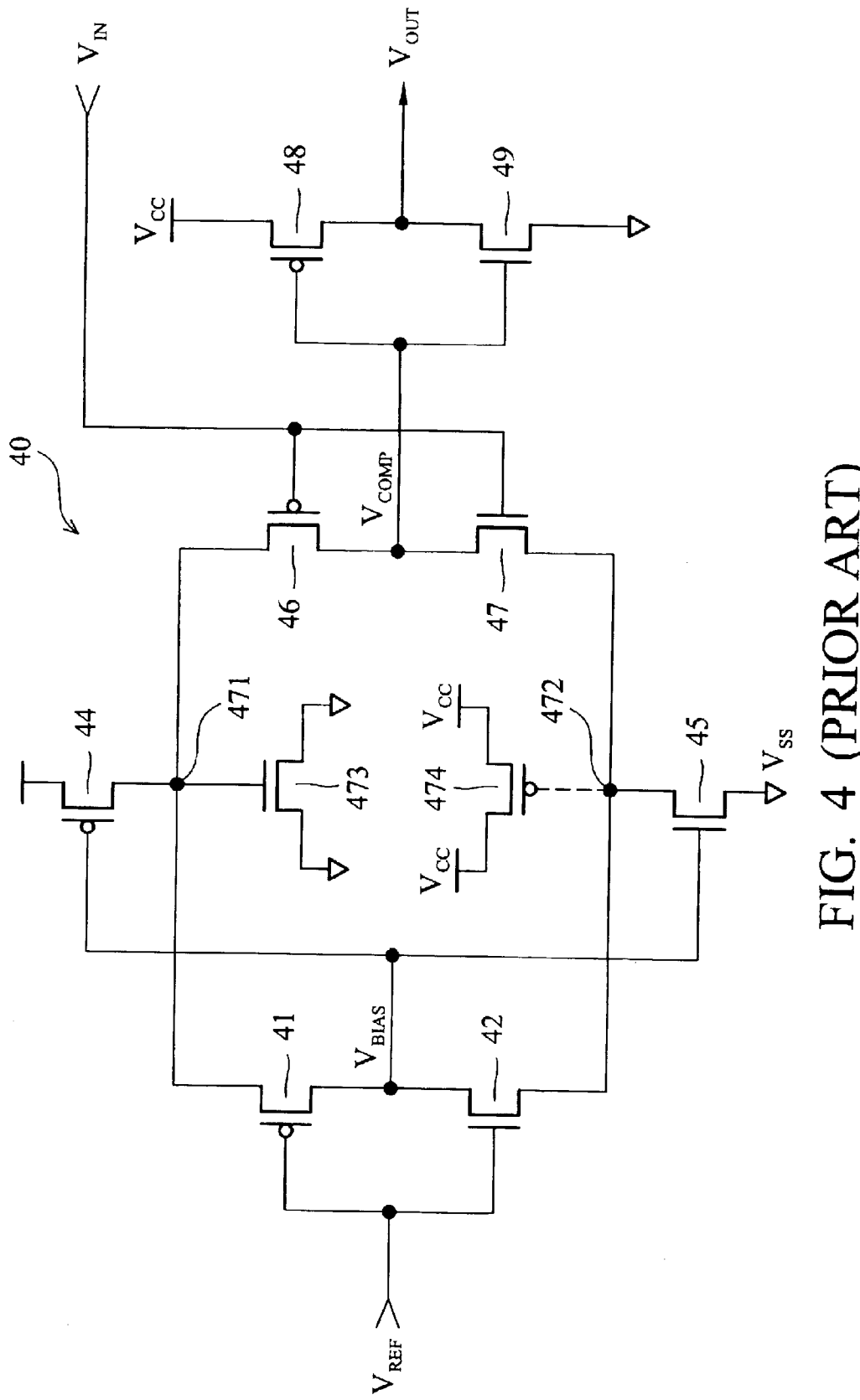
FIG. 4 is a circuit schematic diagram of a self-biased, high-gain differential amplifier disclosed in U.S. Pat. No. 4,937,476.
Figure 5:
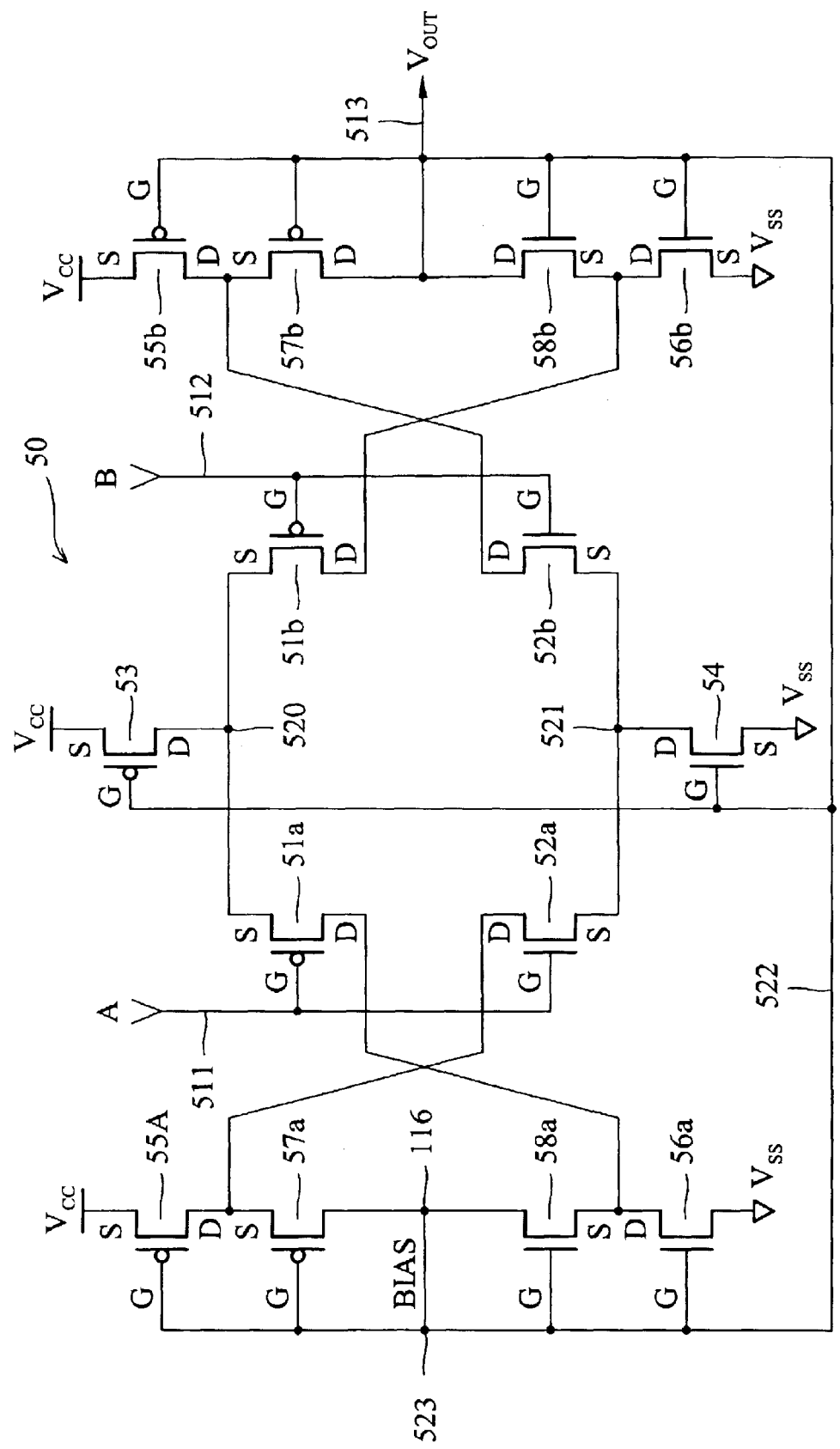
FIG. 5 shows a differential amplifier circuit 50 disclosed in U.S. Pat. No. 4,958,133.

Conversely, differential-mode input voltages are strongly amplified. Again, speaking hypothetically, if a differential input voltage VDIF is coupled across the input lines 11 and 12, an equivalent circuit, which is shown in FIG. 2, is derived. In the equivalent circuit of FIG. 2, a voltage supply 26 is coupled between a node 29 and Vss, representing the common-mode voltage VCOM. A voltage supply 27 coupled between the node 29 and input line 11 and a voltage supply 28 coupled between node 29 and input line 12 represent the differential input voltage values. Each voltage supply 27 and 28 has the value VDIF/2. The voltage on the line 11 is given by VCOM+VDIF/2, while the voltage on the input line 12 is given by VCOM−VDIF/2. Therefore, the voltage on input line 12 is lower by a value of (VCOM+VDIF/2)−(VCOM−VDIF/2) which equals VDIF, if VOUT is to be identical to VBIAS.

If VDIF is positive, then transistor 1b will conduct more than transistor 1a, thereby raising the drain voltage of transistor 6b with respect to transistor 6a and causing VOUT to rise above VBIAS. Likewise, transistor 2b will conduct less than transistor 2a, thereby raising the supply voltage of transistor 7b with respect to transistor 7a, and also causing VOUT to rise above VBIAS. Thus, a positive differential voltage VDIF causes VOUT to rise above VBIAS through two paths. Equivalently, a negative VDIF causes VOUT to fall below VBIAS through two paths.

The two pairs of input transistors 1a–b and 2a–b conduct over different portions of the common-mode range. The transistors 1a–b conduct common-mode input voltages that range from VSSIO up to approximately VDDIO−|VT1|−0.5v, where VT1 is the threshold voltage of the transistors 1a–b. The transistors 2a–b conduct common-mode input voltages that range from approximately VSSIO+|VT2|+0.5v up to VDDIO, where VT2 is the threshold voltage of the transistors 2a–b. Thus, three regions of operation can be defined for the input devices as follows:

Region 1: VSSIO to VSSIO+|VT2|+0.5v, where the transistors 1a–b conduct, while transistors 2a–b are cut off.

Region 2: VSSIO+|VT2|+0.5v to VDDIO–|VT1|–0.5v, where both transistor pairs 1a–b and 2a–b conduct.

Region 3: VDDIO–|VT1|–0.5v to VDDIO, where the transistors 2a–b conduct, while the transistors 1a–b are cut off.

Therefore, one or both of the input pairs conduct over the entire common-mode range of input voltages from VSSIO to VDDIO. The differential-mode gain of the amplifier varies, therefore, according to the common-mode voltage at the input. The differential-mode gain in the regions 1 and 3 is approximately half the differential-mode gain in the region 2. However, the differential-mode gain is not zero and is still sufficient to provide amplification gain.

The differential amplifier in this embodiment is suitable for a receiver in computer and information processing systems. In computer and information processing systems, various integrated circuit chips must communicate digitally with each other over common buses. The receiving bus nodes recognize the signal as being high or low using receivers, which are also referred to as input buffers. Often the receiver is a differential receiver, i.e. a receiver that detects the difference between two input signals, referred to as the differential inputs. These input signals may be a received signal and a reference voltage or they may be a received signal and the inverse of the received signal. In either case, it is the difference between the two input signals that the receiver detects in order to determine the state of the received signal.

Integrated circuits are powered at certain voltage levels, which levels are then provided to the various components, such as the receivers, which are located on the integrated circuit. However, for power consumption reduction and as the size of CMOS technology shrinks, the gate oxide of the MOSFET used in core logic becomes thinner and the threshold voltage becomes lower to decrease the nominal supply voltage for the integrated circuits. Additionally, the input/output and supply voltage of the interface circuit communicates outside the chip is still high, to comply with previous technologies which utilize thicker gate oxide and higher threshold voltage. The breakdown voltage of the gate oxide is proportional to its thickness. Thus, it is noted that, in FIG. 1, the transistors 1a, 2a, 1b, and 2b receiving the input signals Vref and Vin have thicker gate oxides (represented by bold gates).

In the self-bias circuit, the transistors 5a~7a have thinner gate oxides. Since the node bias in FIG. 1 is set in a range from ⅓ VDDIO to ½ VDDIO, the thin oxide NMOS transistors 5a~7a are free from damage if the VBIAS is lower than VDD, the normal operating voltage of the thin oxide devices. Similarly, the thin oxide PMOS transistors 5b~7b are free from damage if (VDDIO-VBIAS) is lower than VDD. Therefore, the supply voltage VDDIO may range from VDD to 2VDD.

The mentioned differential amplifier has the following advantages with regard to reliability and function. Since all input signals (Vref and Vin) connect the IO MOSFETs with a thick gate oxide device, the thick gate oxide bears the input voltage and maintains device reliability. All thin gate oxide devices are biased safely and are free from gate oxide stress. Higher supply current is provided by using thin gate oxide as a current supply. No additional voltage supply of 3.3V or higher than VDDIO is necessary. Since the supply current is provided by thin oxide MOSFETs, the circuit area of the current supplies may be reduced. No additional zero Vt or low Vt IO device is necessary.

In conclusion, the present invention provides a low supply voltage and self-biased high speed receiver comprising both thin and thick gate oxide MOSFETs in deep submicron technology. The receiver operates with an IO supply voltage higher than its core MOSFET operating voltage. The input signals are received by the thick gate oxide devices and the thin gate oxide devices are free from gate oxide stress, which eliminates the reliability problem. The current supplies formed by thin oxide devices provide a high supply current so that no additional higher voltage supply or low Vt IO device is necessary, and the circuit area for the current supplies is reduced.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A differential operational amplifier comprising:
a first and second transistor of a first type, having sources coupled together, gates respectively coupled to receive a first and second input signal, and drains respectively coupled to receive a bias voltage and outputting an output signal;
a third transistor of the first type having a source coupled to receive a first supply voltage, a gate coupled to receive the bias voltage and a drain coupled to the sources of the first and second transistors;
a fourth and fifth transistor of the first type, and a sixth transistor of a second type, all of which are coupled in series between the first and a second supply voltage, and have gates commonly coupled to the drain of the fifth transistor, the drain of the fifth transistor outputting the bias voltage;
an eighth and ninth transistor of the first type, and a tenth transistor of the second type, all of which are coupled in series between the first and second supply voltage, and have gates commonly coupled to receive the bias voltage, the drain of the ninth transistor coupled to the drain of the second transistor; and
an eleventh and seventh transistor of the second type having sources commonly coupled to the drain of the second transistor, drains commonly coupled to receive the bias voltage, and gates respectively coupled to the drain of the second transistor and the bias voltage;
wherein gate oxides of the first and second transistors are thicker than the other transistors.

2. The differential operational amplifier as claimed in claim 1, wherein the first and second type are P and N type, and the first and second supply voltage are VDDIO and VSSIO, respectively.

3. The differential operational amplifier as claimed in claim 1, wherein the first and second type are N and P type, and the first and second supply voltage are VSSIO and VDDIO, respectively.

4. A differential operational amplifier comprising:
a first and second transistor of a first type, and a third and fourth transistor of a second type, the first and second transistor having sources coupled together, gates respectively coupled to receive a first and second input signal, and drains respectively coupled to receive a bias voltage and outputting an output signal, the third and fourth transistor having sources coupled together, gates respectively coupled to receive the first and second input signal, and drains;

a fifth and sixth transistor respectively of the first and second type having sources coupled to receive a first and second supply voltage, gates commonly coupled to receive the bias voltage and drains coupled to the sources of the first and second transistors and the third and fourth transistors, respectively;

a seventh and eighth transistor of the first type, and a ninth transistor of the second type, all of which are coupled in series between the first and second supply voltage, and have gates commonly coupled to the drain of the eighth transistor, the drain and source of the eighth transistor respectively outputting the bias voltage and coupled to the drain of the third transistor a tenth and eleventh transistor of the first type, and a twelfth transistor of the second type, all of which are coupled in series between the first and second supply voltage, and have gates commonly coupled to receive the bias voltage, the drain and source of the eleventh transistor respectively outputting the output signal and coupled to the drain of the fourth transistor; and a thirteenth and fourteenth transistor of the second type having sources commonly coupled to the drain of the eleventh transistor, drains commonly coupled to receive the bias voltage, and gates respectively coupled to the drain of the eleventh transistor and the bias voltage;

wherein gate oxides of the first, second, third and fourth transistors are thicker than those of the others.

5. The differential operational amplifier as claimed in claim 4, wherein the first and second type are P and N type, and the first and second supply voltage are VDDIO and VSSIO, respectively.

6. A receiver comprising: an interface circuit having a differential amplifier comprising:

a first and second transistor of a first type, having sources coupled together, gates respectively coupled to receive a first and second input signal, and drains respectively coupled to receive a bias voltage and outputting an output signal;

a third transistor of the first type having a source coupled to receive a first supply voltage, a gate coupled to receive the bias voltage and a drain coupled to the sources of the first and second transistors;

a fourth and fifth transistor of the first type, and a sixth transistor of a second type, all of which are coupled in series between the first and a second supply voltage, and have gates commonly coupled to the drain of the fifth transistor, the drain of the filth transistor outputting the bias voltage;

an eighth and ninth transistor of the first type, and a tenth transistor of the second type, all of which are coupled in series between the first and second supply voltage, and have gates commonly coupled to receive the bias voltage, the drain of the ninth transistor coupled to the drain of the second transistor; and an eleventh and seventh transistor of the second type having sources commonly coupled to the drain of the second transistor, drains commonly coupled to receive the bias voltage, and gates respectively coupled to the drain of the second transistor and the bias voltage;

wherein gate oxides of the first and second transistors are thicker than those of the others; and a core circuit receiving the output signal from the interface circuit.

7. The receiver as claimed in claim 6, wherein the first and second type are P and N type, and the first and second supply voltage are VDDIO and VSSIO, respectively.

8. The receiver as claimed in claim 6, wherein the first and second type are N and P type, and the first and second supply voltage are VSSIO and VDDIO, respectively.

9. A receiver comprising: an interface circuit having a differential amplifier comprising:

a first and second transistor of a first type, and a third and fourth transistor of a second type, the first and second transistor having sources coupled together, gates respectively coupled to receive a first and second input signal, and drains respectively coupled to receive a bias voltage and outputting an output signal, the third and fourth transistor having sources coupled together, gates respectively coupled to receive the first and second input signal, and drains;

a fifth and sixth transistor respectively of the first and second type having sources coupled to receive a first and second supply voltage, gates commonly coupled to receive the bias voltage and drains coupled to the sources of the first and second transistors, and the third and fourth transistors, respectively;

a seventh and eighth transistor of the first type, and a ninth transistor of the second type, all of which are coupled in series between the first and second supply voltage, and have gates commonly coupled to the drain of the eighth transistor, the drain and source of the eighth transistor respectively outputting the bias voltage and coupled to the drain of the third transistor;

a tenth and eleventh transistor of the first type, and a twelfth transistor of the second type, all of which are coupled in series between the first and second supply voltage, and have gates commonly coupled to receive the bias voltage, the drain and source of the eleventh transistor respectively outputting the output signal and coupled to the drains of the fourth transistor; and a thirteenth and fourteenth transistor of the second type having sources commonly coupled to the drain of the eleventh transistor, drains commonly coupled to receive the bias voltage, and gates respectively coupled to the drain of the eleventh transistor and the bias voltage;

wherein gate oxides of the first, second, third and fourth transistors are thicker than those of the others; and a core circuit receiving the output signal from the interface circuit.

10. The receiver as claimed in claim 9, wherein the first and second type are P and N type, and the first and second supply voltage are VDDIO and VSSIO, respectively.

* * * * *